United States Patent [19]

Tomita et al.

[11] Patent Number: 6,054,373
[45] Date of Patent: Apr. 25, 2000

[54] METHOD OF AND APPARATUS FOR REMOVING METALLIC IMPURITIES DIFFUSED IN A SEMICONDUCTOR SUBSTRATE

[75] Inventors: Hiroshi Tomita; Hisashi Muraoka, both of Yokohama; Ryuji Takeda, Shibata, all of Japan

[73] Assignees: Kabushiki Kaisha Toshiba, Kawasaki; Purex Co., Ltd., Yokohama; Toshiba Ceramics Co., Ltd., Tokyo, all of Japan

[21] Appl. No.: 09/006,996

[22] Filed: Jan. 14, 1998

[30] Foreign Application Priority Data

Jan. 20, 1997 [JP] Japan .................................. 9-007893

[51] Int. Cl.$^7$ .................................................. H01L 21/322
[52] U.S. Cl. ............................................ 438/476; 438/471
[58] Field of Search ..................................... 438/476, 477, 438/471; 156/7

[56] References Cited

U.S. PATENT DOCUMENTS

| | | | |
|---|---|---|---|
| 3,923,567 | 12/1975 | Lawrence | 156/7 |
| 5,100,501 | 3/1992 | Blumenthal | 156/643 |
| 5,426,061 | 6/1995 | Sopori | 437/11 |
| 5,840,590 | 11/1998 | Myers, Jr. et al. | 437/11 |

*Primary Examiner*—Charles Bowers
*Assistant Examiner*—Nema Berezny
*Attorney, Agent, or Firm*—Finnegan, Henderson, Farabow, Garrett & Dunner, L.L.P.

[57] ABSTRACT

A method of removing metallic impurities diffused in a semiconductor substrate, comprising, the semiconductor-substrate-heating step of heating a semiconductor substrate to at least 200° C. or higher and promoting the release and rediffusion of metallic impurities diffused in the semiconductor substrate, and the metallic-impurity-removing step of dissolving the metallic impurities arrived at the surface of the semiconductor substrate with a chemical agent and removing them from the substrate.

10 Claims, 4 Drawing Sheets

METHOD OF AND APPARATUS FOR REMOVING METALLIC IMPURITIES DIFFUSED IN A SEMICONDUCTOR SUBSTRATE

BACKGROUND OF THE INVENTION

This invention relates to a method of and apparatus for removing metallic impurities diffused in a semiconductor substrate, and more particularly to a method of and apparatus capable of effectively removing metallic impurities diffused in a substrate, which could not be removed by conventional wet cleaning methods.

Wet cleaning techniques have been widely used to remove metallic impurities on the surface of a silicon substrate. A typical one of the wet cleaning techniques is the RCA method. This method is strictly intended for cleaning the surface of a silicon substrate, so it cannot be applied to the removal of metallic impurities diffused in a silicon substrate.

Therefore, to remove metallic impurities from silicon substrates, gettering techniques classified as intrinsic gettering (IG) and extrinsic gettering (EG) have been used. The gettering techniques are the techniques for trapping metallic impurities diffused in a silicon substrate in a place away from an active-layer-forming area, that is, in a gettering site.

Intrinsic gettering (IG) is a gettering technique where a gettering site is formed in the substrate. Extrinsic gettering (EG) is a gettering technique where a gettering site is formed at the front or back surface of the substrate.

Intrinsic gettering is the gettering technique making use of an oxygen precipitation phenomenon taking place in a CZochralski(CZ) silicon crystal. Specifically, with the technique, a defect-free region is formed at the surface layer of a silicon substrate and at the same time, a bulk defect is forced to develop in the silicon substrate. Then, metallic impurities diffused in the silicon substrate are caused to precipitate in the distorted field (IG layer) around the defect, thereby suppressing the precipitation of metallic impurities in the active layer in the defect-free region.

By the gettering technique, however, metallic impurities are just trapped from the active layer into the gettering site and not removed from the substrate. This causes the problem that the metallic impurities trapped in the gettering site are released from the gettering site and contaminate the active layer in subsequent high-temperature processes.

BRIEF SUMMARY OF THE INVENTION

A first object of the present invention is to provide a method of releasing and rediffusing metallic impurities diffused in a semiconductor substrate within the substrate and removing the impurities from the substrate by causing the impurities to dissolve in a chemical agent supplied outside the substrate.

A second object of the present invention is to provide a method of compensating for the drawback of gettering techniques by removing metallic impurities to the outside of the substrate.

A third object of the present invention is to provide a substrate heating method capable of heating the inside of the substrate as high as possible to release and rediffuse metallic impurities within the substrate.

According to a first aspect of the present invention, there is provided a method of supplying a chemical agent to the surface of a semiconductor substrate and simultaneously heating the semiconductor substrate to release and rediffuse metallic impurities in the semiconductor substrate to allow them to move to the surface of the semiconductor substrate, thereby dissolving them with the chemical agent to remove them.

In conventional semiconductor substrate cleaning techniques, metallic impurities diffused in the substrate were considered unable to be removed with a chemical agent. Metallic impurities in the substrate were just moved from the active layer by using the above-described gettering techniques. The study of the inventors of the present invention has shown that metallic impurities in the substrate can be removed effectively by supplying a liquid chemical agent to the surface of the semiconductor substrate, with the semiconductor substrate being heated to a high temperature that cannot be considered in ordinary wet cleaning techniques.

Therefore, a chemical agent suitable for the present invention has to be an acid that is liquid even at high temperatures and has the ability to dissolve metallic impurities. Such a chemical agent is an acid whose boiling point is 200° C. or higher, such as sulfuric acid (whose boiling point is 310° C.) or phosphoric acid (whose boiling point is 213° C.).

The chemical agent may be sprayed in the form of vapor on the semiconductor substrate and allowed to condense on the surface of the semiconductor substrate. This makes it possible to increase the purity of the chemical agent supplied to the surface of the semiconductor substrate.

The treatment of the semiconductor substrate at a specific pressure enables the boiling point of the chemical agent to rise. This makes it possible to remove metallic impurities at higher temperatures, enhancing the effect.

According to a second aspect of the present invention, the application of a method of the present invention to a semiconductor substrate subjected to an intrinsic gettering process compensates for the drawback of intrinsic gettering, enabling metallic impurities to be removed effectively as explained below.

In intrinsic gettering, heavy metals, typical examples of which are Cu and Ni, existing in a CZ silicon substrate are trapped in the IG layer. When the temperature of the substrate rises, however, the metallic impurities are released from the IG layer and become mobile again.

The amount of metallic impurity release from the IG layer is closely related to the solid soluble limit concentration of the metallic impurities in the silicon substrate. As the temperature is raised, the solid soluble limit concentration increases, resulting in an increase in the amount of metallic impurity release.

As a result, conventional intrinsic gettering causes the problem that subjecting the silicon substrate to a high-temperature process permits the metallic impurities once trapped in the IG layer to be released.

With the present invention, the metallic impurities arrived at the surface of the silicon substrate are caused to dissolve in a chemical agent to remove them at such a temperature as promotes the rediffusion of metallic impurities within the silicon substrate.

Specifically, when metallic impurities in the substrate have been released, the metallic impurities diffuse in such a manner that the concentration gradient of the metallic impurities in the substrate disappears. This allows the metallic impurities to arrive at the surface of the substrate.

When the metallic impurities in the vicinity of the substrate surface have been removed and the concentration of metallic impurities at the surface of the substrate has decreased, metallic impurities begin to diffuse from the inside of the substrate (IG layer) toward the surface of the substrate. Once the diffused metallic impurities have reached the substrate surface, they are dissolved in the supplied chemical agent and removed.

Accordingly, the use of the method of the present invention together with intrinsic gettering compensates for the drawback of the intrinsic gettering, enabling metallic impurities to be removed effectively.

According to a third aspect of the present invention, there is provided heating means capable of setting the internal temperature of a semiconductor substrate higher than the temperature of the substrate surface layer in using the above-described method of removing metallic impurities.

Specifically, with the present invention, because a liquid chemical agent has to be supplied to the surface of the semiconductor substrate, the temperature of the substrate surface must be at the boiling point of the chemical agent or lower. On the other hand, to increase the amount of metallic impurity rediffusion in the substrate, the internal temperature of the substrate has to be raised as much as possible. To meet this requirement, for example, use of infrared heating means enables the internal temperature of the substrate to be raised more than that of the surface layer of the semiconductor substrate, which promotes the rediffusion of metallic impurities within the substrate, enabling the metallic impurities to be removed effectively.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, referring to the accompanying drawings, embodiments of the present invention will be explained.

(First Embodiment)

Figure 1:
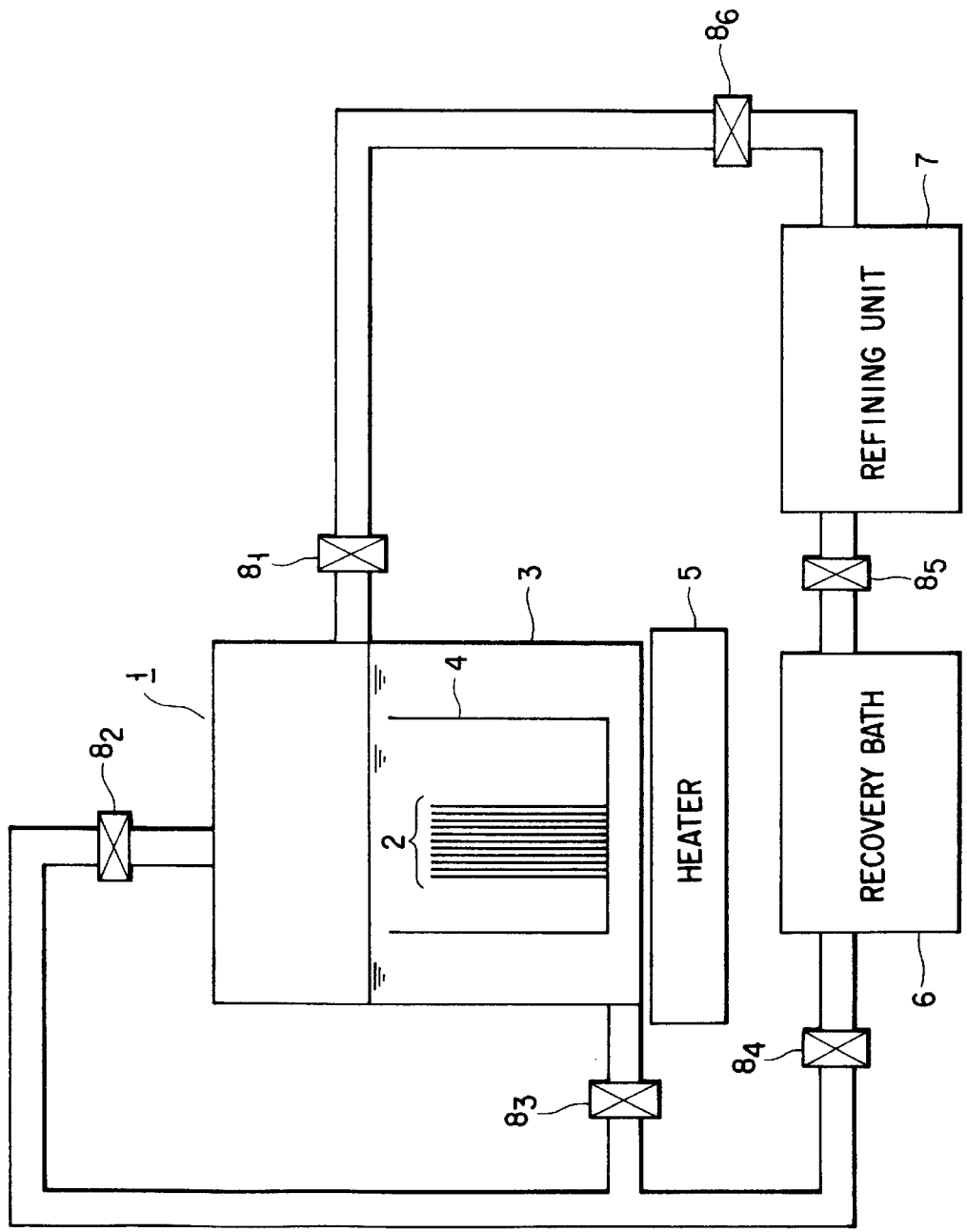
FIG. 1 is a pictorial view of a batch treatment apparatus according to a first embodiment of the present invention.

FIG. 1 is a pictorial view of a silicon substrate batch treatment apparatus according to a first embodiment of the present invention. In the first embodiment, a case where a silicon substrate contaminated with Cu is treated using liquid sulfuric acid (sulfuric acid solution) will be explained.

In FIG. 1, numeral 1 indicates a treatment bath used to clean silicon substrates 2. The treatment bath 1 is roughly composed of a quartz beaker 3 and a quartz carrier 4.

The beaker 3 holds a sulfuric acid solution acting as a cleaning chemical agent. The carrier 4 is designed to be immersed in the beaker 3 during treatment. The carrier 4 is also designed to allow a plurality of silicon substrates 2 to be set, which enables a plurality of silicon substrates 2 to be treated at a time.

Under the beaker 3, a heater 5 is provided. With the heater 5, the temperature of the sulfuric acid solution in the beaker 3 can be set at a specific high temperature (in the case, 300° C.).

Because the beaker 3 and carrier 4 are both made of quartz, they can withstand as high a temperature as 300° C. Namely, the treatment apparatus of the first embodiment uses a high-temperature sulfuric acid solution as a chemical agent and treats the silicon substrates 2, while heating them.

The treatment apparatus of the first embodiment is a recycling treatment apparatus with a sulfuric acid recovering and refining function. The sulfuric acid vapor generated by the heating of the heater 5 and the used sulfuric acid are gathered into a recovery bath 6 and cooled.

The metallic impurities-dissolved sulfuric acid solution in the recovery bath 6 is purified via a refining system 7. As a result, the metallic impurities are removed and the refined sulfuric acid solution is supplied to the beaker 3 and used again as a cleaning chemical agent. In FIG. 1, $8_1$ to $8_6$ indicate valves. These valves $8_1$ to $8_6$ are open during treatment.

The refining system 7 may be a system that mainly uses an ion-exchange resin or a system that supplies an oxidizer, such as ozone gas, to change the dissolved metallic ions into metallic oxide and filters it.

Regarding a system of the latter type that supplies ozone gas into the sulfuric acid solution and removes metallic impurities in the form of metallic oxide, the effect of the system will be described concretely below.

Ozone gas (about 10 ppm in the sulfuric acid solution) was introduced by bubbling into the sulfuric acid solution in which 0.1 ppm of Cu had dissolved. After the state was kept for about 10 minutes, the sulfuric acid solution was purified by distillation. As a result, it was confirmed that the Cu concentration in the refined sulfuric acid solution was of the order of about 1 ppb (several percents). At the same time, it was verified that CuO powder was present as the residue. On the other hand, when refining was done by distillation without introducing ozone gas, the effect of refinement could hardly be seen and Cu remained diffused in the refined sulfuric acid solution.

Next, a method of cleaning the silicon substrate 2 by means of the treatment apparatus constructed as described above will be explained concretely.

First, silicon substrates 2 are set in the carrier 4 and immersed in the beaker 3 that holds sulfuric acid solution. Then, by heating the sulfuric acid solution and silicon substrate 2 with the heater 5, the silicon substrate 2 is cleaned.

At this time, it is desirable that the heater 5 should be adjusted so as to heat the sulfuric acid solution and silicon substrate at as high a temperature as possible in the range where the temperature of the contact region of the silicon substrate 2 and sulfuric acid solution does not exceed the boiling point (310° C.) of sulfuric acid. Specifically, the heater 5 is adjusted so that the sulfuric acid solution in contact with the surface of the substrate may be at as high a temperature as possible in the range where the solution remains fluid. In this case, heating is done so that the temperature of the sulfuric acid solution may be at 300° C.

The evaluation of such a cleaning method has shown the following result.

CZ-Si wafers contaminated with $1 \times 10^{13} cm^{-3}$ of Cu were set in the carrier 4 as silicon substrates 2 and the wafers were cleaned with a sulfuric acid solution at 300° C. for 10 minutes. Thereafter, the CZ-Si wafers were taken out and the remaining Cu concentration was measured. It was confirmed from the measurement that it was less than $1 \times 10^{12} cm^{-3}$, or the Cu removal rate was more than 90%.

For the sake of confirmation, the Cu concentration in the sulfuric acid solution was measured. It was confirmed from the measurement that Cu increased from about 5 ppb before cleaning to about 1 ppm after cleaning and that Cu dissolved from the silicon substrate into the sulfuric acid solution.

While in the first embodiment, the silicon substrates 2 were cleaned with the valves $8_1$ to $8_6$ open, cleaning with the valves $8_1$ to $8_6$ closed enables the treatment to be carried out with the chamber internal pressure being raised.

When cleaning is done with the beaker 3 being airtight, the boiling point of the sulfuric acid solution can be raised as compared with a cleaning method in a normal pressure atmosphere, which enables cleaning at higher temperatures.

Figure 6:
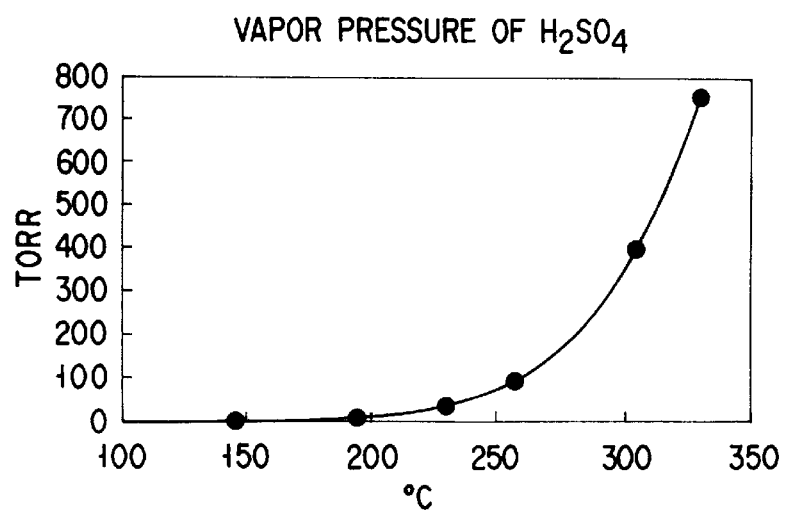
FIG. 6 shows a vapor pressure curve of sulfuric acid.

FIG. 6 is a graph showing a vapor pressure curve of sulfuric acid. As estimated from the graph, it is obvious that the boiling point of sulfuric acid rises under pressure.

When treatment is carried out in a pressurized, high-temperature atmosphere, especially when a silicon substrate 2 with an IG layer is treated, the amount of release of metallic impurities trapped in the IG layer can be increased. This makes it easier to diffuse metallic impurities from the inside of the substrate to the surface of the substrate, enabling metallic impurities within the substrate to be removed more effectively.

While, the treatment apparatus or the first embodiment having the configuration that recovers the chemical agent during cleaning and refines it has been explained, the apparatus may have a configuration that refines the chemical agent collectively after cleaning or a configuration that refines the agent both during and after cleaning. The same is true for treatment apparatuses of the other embodiments.

In the case of cleaning silicon substrates, the chemical agent has a boiling point of 200° C. or higher. Preferably, the boiling point is 300° C. or higher. The reason for this will be given later.

In the present invention, for example, sulfuric acid, phosphoric acid, and a chemical liquid obtained by adding fluoric acid to these may be used.

The purpose of adding fluoric acid is to remove a natural oxide film formed on the silicon substrate by water and oxygen diffused in the chemical liquid during cleaning. The concentration of fluoric acid added in the chemical liquid is, for example, about 0.1% or less.

The highest treatment temperature in the case of the chemical agent is about 290° C. to 350° C. for sulfuric acid and fluoric-acid-added sulfuric acid and 213° C. for fluoric-acid-added phosphoric acid.

Figure 2:
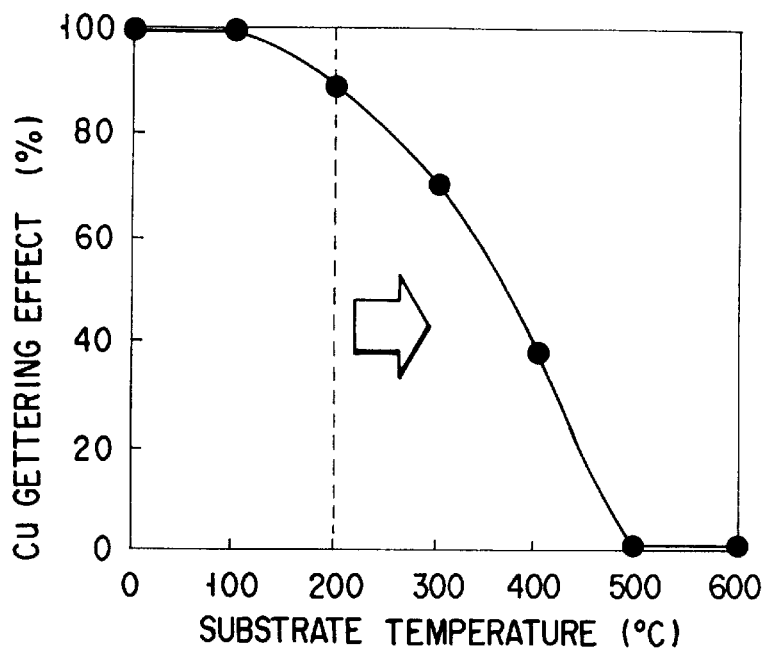
FIG. 2 is a characteristic diagram showing the relationship between the Cu gettering effect at the IG layer in a silicon substrate and the temperature of the substrate.

FIG. 2 is a characteristic diagram showing the relationship between the Cu gettering effect at the IG layer in the silicon substrate and the temperature of the substrate at a specific contamination level.

As seen from the figure, the gettering effect of the IG layer begins to decrease at temperatures higher than 200° C. and the IG layer hardly traps Cu at 400° C. That is, the higher the temperature of the substrate, the more the IG layer releases Cu. This allows Cu to diffuse freely throughout the silicon substrate.

Because the metallic impurities arriving at the surface of the silicon substrate have to be dissolved in the chemical liquid, the surface temperature of the substrate must be kept lower than the boiling point.

Therefore, it can be understood that use of a chemical agent whose boiling point is 200° C. or higher like the aforementioned chemical agent enables treatment at a substrate temperature of 200° C. or higher, which promotes the release of metallic impurities, such as CU, from the IG layer. This makes it possible to remove metallic impurities in the silicon substrate effectively.

Basically, as the temperature of the substrate is increased, metallic impurities can be removed more effectively. In the case of Cu, as seen from FIG. 2, the effect of removing Cu is constant at 500° C. or higher at the contamination level.

Figure 3:
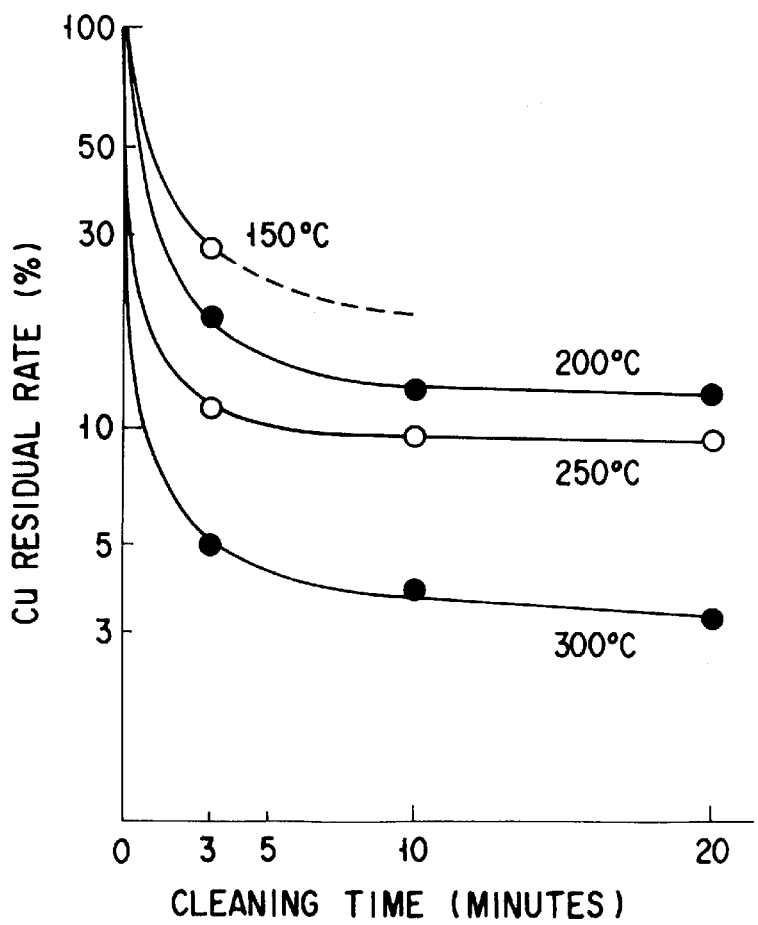
FIG. 3 is a characteristic diagram showing the relationship between the cleaning effect (Cu residual rate) and the cleaning temperature.

FIG. 3 is a characteristic diagram showing the relationship between the effect of removing metallic impurities from the substrate (Cu residual rate) and the treatment temperature. For a specimen, a silicon substrate whose initial Cu concentration is $1 \times 10^{14}$ atoms/cm$^3$ was used. For the chemical agent, sulfuric acid was used.

It can also be understood that when the treatment temperature is 100 to 150° C., the Cu residual rate is 30% or more and that when the treatment temperature is 200° C. or higher, the Cu residual rate is 15% or less. Particularly, when the treatment temperature is 300° C., the Cu residual rate is less than 5%, which is a high treatment effect. The method of cleaning a silicon substrate with a chemical liquid at such high temperatures produces the great cleaning effect that could not be expected from conventional surface cleaning methods.

While in the first embodiment, the batch treatment apparatus has been explained, the characterized sections of the batch treatment apparatus can be applied to a single-wafer treatment apparatus.

(Second Embodiment)

Figure 4:
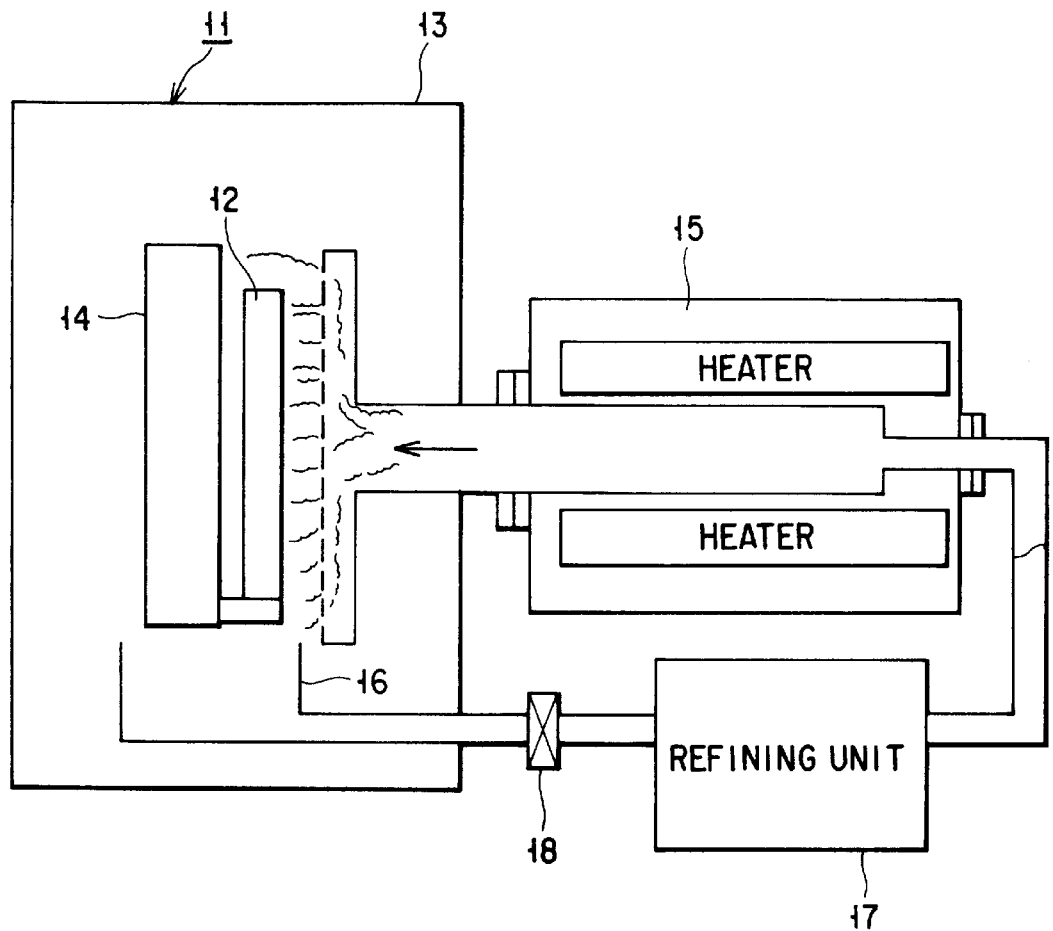
FIG. 4 is a pictorial view of a single-wafer treatment apparatus according to a second embodiment of the present invention.

FIG. 4 is a pictorial view of a single silicon-wafer treatment apparatus according to a second embodiment of the present invention.

The treatment apparatus of the second embodiment differs from that of the first embodiment in that a gaseous (vaporous) chemical agent is introduced into a treatment chamber and supplied to the silicon substrates. The temperature of the silicon substrates is set lower than the boiling point of the chemical agent. The gaseous chemical agent is condensed into liquid on the surface of the silicon substrate. As a result, the second embodiment produces a similar effect to that of the first embodiment. The effect of the second embodiment is greater than that of the first embodiment.

In FIG. 4, numeral 11 indicates a treatment bath with a heat-retaining function for cleaning the silicon substrates 12. The treatment bath 11 is roughly composed of a treatment chamber 13 and a quartz holder 14 with a built-in heater.

A single silicon substrate 12 can be set in the holder 14. The set silicon substrate 12 is set at a temperature lower than the boiling point of a chemical agent, such as sulfuric acid, by the heater built in the holder 14.

The gaseous chemical agent generated by a vapor generator 15 is supplied to the set silicon substrate 12. The gaseous chemical agent supplied to the silicon substrate 12 collides with the surface of the silicon substrate 12 and is cooled and condensed into a chemical liquid. The chemical liquid removes metallic impurities and drips from the bottom of the silicon substrate 12. The dripped liquid is gathered in a recovery bath 16.

The gathered chemical liquid is purified by a refining unit 17 of, for example, the ion-exchange resin type or the oxidizing agent type. As a result, the metallic impurities in the gathered chemical liquid have been removed and the refined sulfuric acid solution is supplied to the vapor generator 15 and used again as a cleaning chemical agent. In FIG. 4, numeral 18 indicates a valve, which is normally open during cleaning.

In the second embodiment, because the gaseous chemical agent is supplied to the silicon substrate 12, the purity of the chemical agent at the surface of the silicon substrate 12 is higher than when a liquid chemical agent is supplied. Consequently, the chemical agent of a high degree of purity is supplied to the surface of the silicon substrate 12, leading to a much greater cleaning effect.

The purpose of making the temperature of the silicon substrate 12 (substrate temperature) lower than the boiling point of the chemical agent is to cause the chemical liquid to condense. In the case of the silicon substrate 12 with an IG layer, as the substrate temperature gets lower, the amount of metallic impurities released from the IG layer decreases. The rediffusion of metallic impurities from the inside of the substrate toward the surface of the substrate also depends on the substrate temperature. Therefore, to remove metallic impurities sufficiently, it is desirable that the substrate temperature should be as high as possible, provided that it is lower than the boiling point of the chemical liquid.

While in the second embodiment, the single-wafer treatment apparatus has been explained, the characterized sections of the single-wafer treatment apparatus can be applied to a batch treatment apparatus.

(Third Embodiment)

Figure 5:
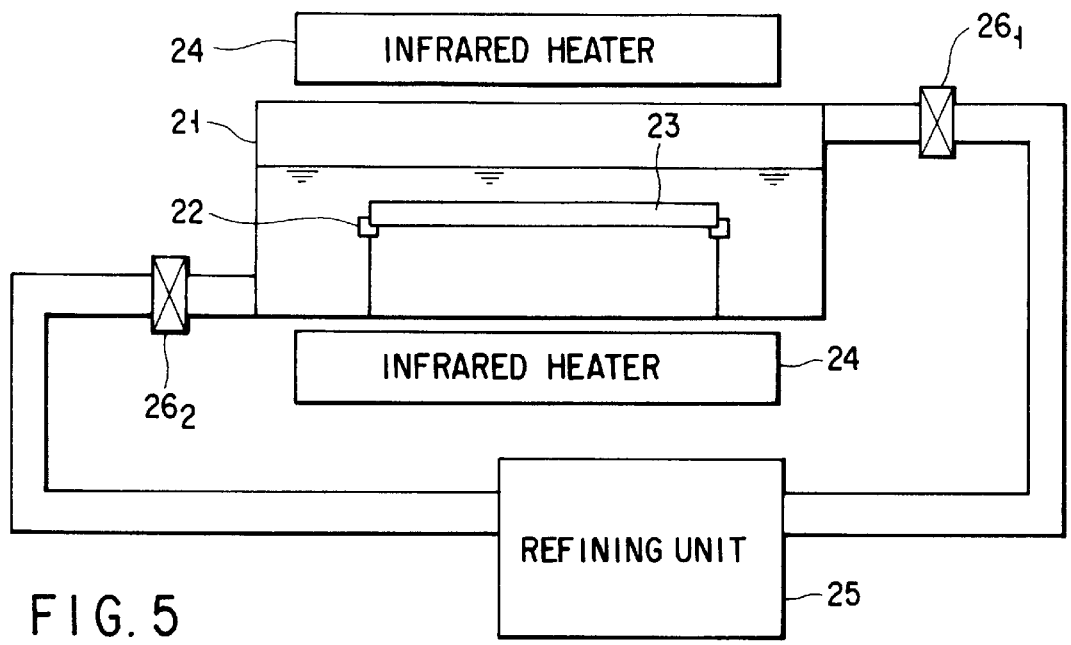
FIG. 5 is a pictorial view of a single-wafer treatment apparatus according to a third embodiment of the present invention.

FIG. 5 is a pictorial view of a single silicon-wafer treatment apparatus according to a third embodiment of the present invention.

In the first and second embodiments, the temperature of the silicon substrate has been kept lower than the boiling point of the chemical agent to prevent the chemical agent from vaporizing at the surface of the substrate. Needless to say, if the inside of the substrate can be heated as high as possible, while the surface of the substrate is being kept lower than the boiling point of the chemical agent, a much greater effect will be produced.

The third embodiment is related to a treatment apparatus with heating means capable of heating the inside of the substrate as high as possible.

The treatment apparatus according to the third embodiment is characterized in that an external infrared heater 24 directly heats a silicon substrate 23 held in a quart beaker 21 by a quart holder 22. The beaker 21 is filled with a chemical liquid.

In the third embodiment, the silicon substrate 23 is selectively heated by infrared rays and the chemical liquid is heated by heat conduction from the silicon substrate 23.

With such a configuration, although the temperature in the silicon substrate 23 rises as a result of infrared heating, the surface of the silicon substrate 23 is cooled by the chemical liquid, so that the temperature at the surface is lower than that in the substrate.

Consequently, by controlling the output of the infrared heater 23 and the flow rate of the chemical agent suitably, heating can be done so that the surface temperature of the silicon substrate 23 may be lower than the boiling point of the chemical liquid and the internal temperature of the silicon substrate 23 may be higher than the boiling point of the chemical liquid.

Particularly when the silicon substrate 23 with an IG layer is cleaned, the IG layer is heated to a temperature higher than that of the surface temperature of the substrate, which makes it easier for heavy metal impurities, such as Cu or Ni, trapped in the IG layer to be released. As a result, the metallic impurities in the substrate can be removed more effectively.

In FIG. 5, numeral 25 indicates a refining system of, for example, the ion-exchange resin type or the oxidizing agent type for removing metallic impurities from the chemical agent, such as sulfuric acid. Numerals $26_1$ and $26_2$ indicate valves.

While in the third embodiment, the single-wafer treatment apparatus has been explained, the characterized sections of the single-wafer treatment apparatus can be applied to a batch treatment apparatus.

The present invention is not limited to the first to third embodiments. For instance, while in the embodiments, sulfuric acid and phosphoric acid have been used as the chemical agent, any chemical agent can be used, provided that it becomes a highly pure chemical liquid of a semiconductor manufacturing grade in the liquid state and has a high boiling point (200° C. or higher for cleaning silicon substrates).

Not only inorganic chemical liquid but also organic chemical liquid can be used. The semiconductor-substrate (wafer) cleaning unit and the heater unit may be either of the vertical installation type or the horizontal installation type.

Metallic impurities removed in the present invention are not restricted to Cu and Ni. It goes without saying that other metals considered to be impurities, such as Fe, Cr, and Na, can also be removed.

Furthermore, the metal-impurity removing method of the present invention may be repeated a plurality of times (an n number of times).

Specifically, the processing method of the present invention cannot remove the metallic impurities in the silicon substrate, for example, in the IG layer, completely. To overcome this problem, in a semiconductor manufacturing process after the execution of the processing method of the invention, when the silicon substrate has been exposed to a high temperature range higher than, for example, 400° C., the processing method of the invention is carried out again after the heating process.

When the silicon substrate is exposed to the high temperature range of 400° C. and above, metallic impurities trapped in IG layer are released and rediffused as shown in FIG. 2. Then, it can be considered that the metallic impurities will move toward the vicinity of the surface of the silicon substrate. After the cleaning, part of the metallic impurities will segregate at the surface of the substrate, and the other will be trapped in IG layer again. Accordingly, by executing the metallic-impurity removing method of the invention again after the heating process, the metallic impurities can be removed effectively.

It goes without saying that the present invention may be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method of removing metallic impurities diffused in a semiconductor substrate, comprising:

a semiconductor-substrate-heating step of heating a semiconductor substrate to at least 200° C. or higher and promoting the release and rediffusion of metallic impurities diffused in the semiconductor substrate; and a metallic-impurity-removing step of dissolving said metallic impurities arrived at a surface of said semiconductor substrate with a chemical agent, having a boiling point of 200° C. or higher, and removing them from said substrate, wherein in said semiconductor-substrate-heating step, the temperature of said surface from which said impurities are removed is maintained at a temperature lower than at least the boiling point of said chemical agent.

2. A method according to claim 1, wherein said semiconductor-substrate-heating step includes a step of immersing said semiconductor substrate in said chemical agent heated to 200° C. or higher and lower than the boiling point of said chemical agent.

3. A method according to claim 1, wherein said semiconductor-substrate-heating step includes a step of supplying said chemical agent heated to a vaporous state to the surface of said semiconductor substrate and causing said chemical agent to condense on the surface of said substrate.

4. A method according to claim 1, wherein said semiconductor-substrate-heating step includes a step of keeping the surface of said substrate at the boiling point of said chemical agent or lower and heating the inside of said substrate to the boiling point of said chemical agent or higher.

5. A method according to claim 1, wherein said chemical agent is sulfuric acid or phosphoric acid heated to 200° C. or higher and lower than the boiling point of said chemical agent.

6. A method according to claim 5, wherein said chemical agent is obtained by adding less than 0.1 weight percent of fluorine to sulfuric acid or phosphoric acid.

7. A method according to claim 1, wherein said metallic impurities include at least one of Fe, Cr, Cu, Ni, and Na.

8. A method according to claim 1, wherein said semiconductor substrate has an intrinsic gettering layer formed in it.

9. A method according to claim 8, wherein said semiconductor-substrate-heating step includes a step of keeping the surface of said substrate at the boiling point of said chemical agent or lower and heating said intrinsic gettering layer to the boiling point of said chemical agent or higher.

10. A method according to claim 1, further comprising a step of placing said semiconductor substrate under pressure and raising the boiling point of said chemical agent.

* * * * *